United States Patent
Auer et al.

(10) Patent No.: US 9,212,893 B2
(45) Date of Patent: Dec. 15, 2015

(54) ABSOLUTE POSITION-MEASURING DEVICE

(71) Applicant: DR. JOHANNES HEIDENHAIN GMBH, Traunreut (DE)

(72) Inventors: Daniel Auer, Traunstein (DE); Erwin Bratzdrum, Surberg (DE)

(73) Assignee: DR. JOHANNES HEIDENHAIN GMBH, Traunreut (DE)

( * ) Notice: Subject to any disclaimer, the term of this patent is extended or adjusted under 35 U.S.C. 154(b) by 133 days.

(21) Appl. No.: 14/056,385

(22) Filed: Oct. 17, 2013

(65) Prior Publication Data
US 2014/0101955 A1    Apr. 17, 2014

(30) Foreign Application Priority Data
Oct. 17, 2012 (DE) .......................... 10 2012 218 890

(51) Int. Cl.
| | |
|---|---|
| *G01B 7/00* | (2006.01) |
| *G01D 3/08* | (2006.01) |
| *G01D 5/347* | (2006.01) |
| *H01L 23/552* | (2006.01) |

(52) U.S. Cl.
CPC ............... *G01B 7/003* (2013.01); *G01D 3/08* (2013.01); *G01D 5/34776* (2013.01); *H01L 23/552* (2013.01); *H01L 2224/48137* (2013.01); *H01L 2224/49175* (2013.01)

(58) Field of Classification Search
CPC ............ G01D 5/34707; G01D 5/2454; G01D 5/34776; G01B 7/003
USPC ................................................. 33/703, 706
See application file for complete search history.

(56) References Cited

U.S. PATENT DOCUMENTS

| | | | | |
|---|---|---|---|---|
| 4,519,140 | A | * | 5/1985 | Schmitt ............................ 33/706 |
| 5,260,568 | A | * | 11/1993 | Ieki ........................... 250/231.18 |
| 5,332,895 | A | * | 7/1994 | Rieder et al. .............. 250/231.14 |
| 5,687,103 | A | | 11/1997 | Hagl et al. |
| 5,856,668 | A | * | 1/1999 | Nelle et al. ................ 250/231.13 |
| 7,475,489 | B2 | * | 1/2009 | Pucher et al. .................... 33/706 |
| 7,508,193 | B2 | * | 3/2009 | Yarimizu et al. .............. 324/174 |

(Continued)

FOREIGN PATENT DOCUMENTS

| | | |
|---|---|---|
| DE | 25 50 378 | 5/1977 |
| DE | 10 2006 004 898 | 8/2007 |

(Continued)

OTHER PUBLICATIONS

European Search Report, dated Sep. 15, 2015, issued in corresponding European Paten t Application No. 13177628.8.

*Primary Examiner* — Christopher Fulton
(74) *Attorney, Agent, or Firm* — Kenyon & Kenyon LLP

(57) ABSTRACT

An absolute position-measuring device includes a first subassembly having a measuring standard on which at least one code track is disposed, and a scanning unit with which, by scanning the at least one code track in a measuring direction, position signals are able to be produced, from which an absolute digital position value is able to be generated. The position-measuring device includes a second subassembly having at least one peripheral unit adapted to perform an additional or auxiliary function of the position-measuring device. The first subassembly and the second subassembly are connected to each other by a plurality of electric lines for the transmission of electrical signals. The first subassembly exclusively includes components which are suitable for use in a radiation area of a machine.

10 Claims, 4 Drawing Sheets

(56) References Cited

U.S. PATENT DOCUMENTS

| | | | |
|---|---|---|---|
| 8,094,323 B2 * | 1/2012 | Kapner | 356/616 |
| 8,242,434 B2 * | 8/2012 | Lippuner | 250/231.13 |
| 8,477,316 B2 * | 7/2013 | Holzapfel | 356/498 |
| 8,848,184 B2 * | 9/2014 | Holzapfel | 356/369 |
| 9,151,598 B2 | 10/2015 | Tiemann | |
| 2013/0062513 A1 * | 3/2013 | Gruber et al. | 250/231.1 |
| 2014/0264037 A1 * | 9/2014 | Hoyt et al. | 250/349 |

FOREIGN PATENT DOCUMENTS

| | | |
|---|---|---|
| DE | 10 2011 006 424 | 10/2012 |
| EP | 0 660 209 | 6/1995 |
| WO | 02/31432 | 4/2002 |
| WO | WO 2013157152 A1 * | 10/2013 |

* cited by examiner

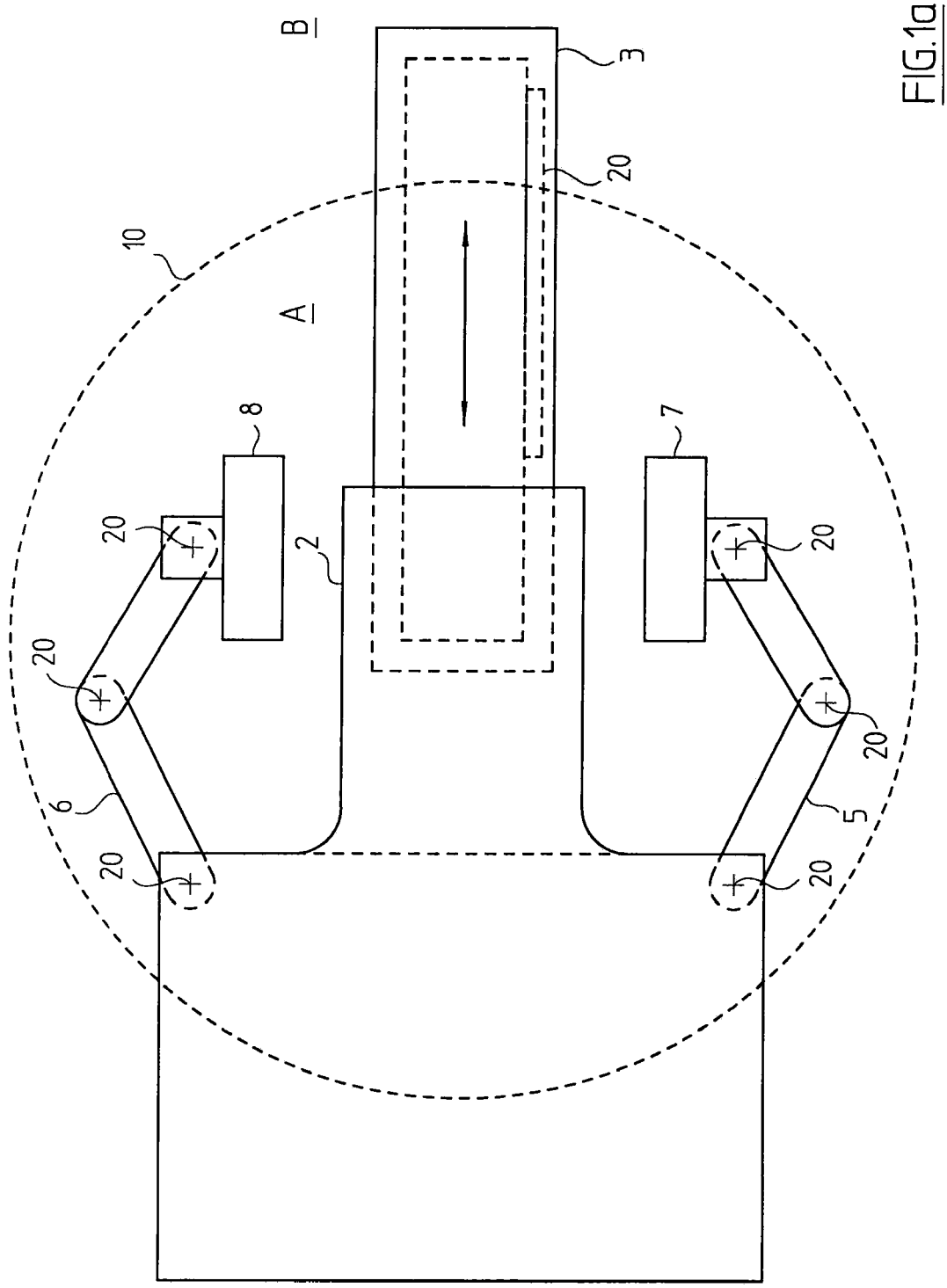

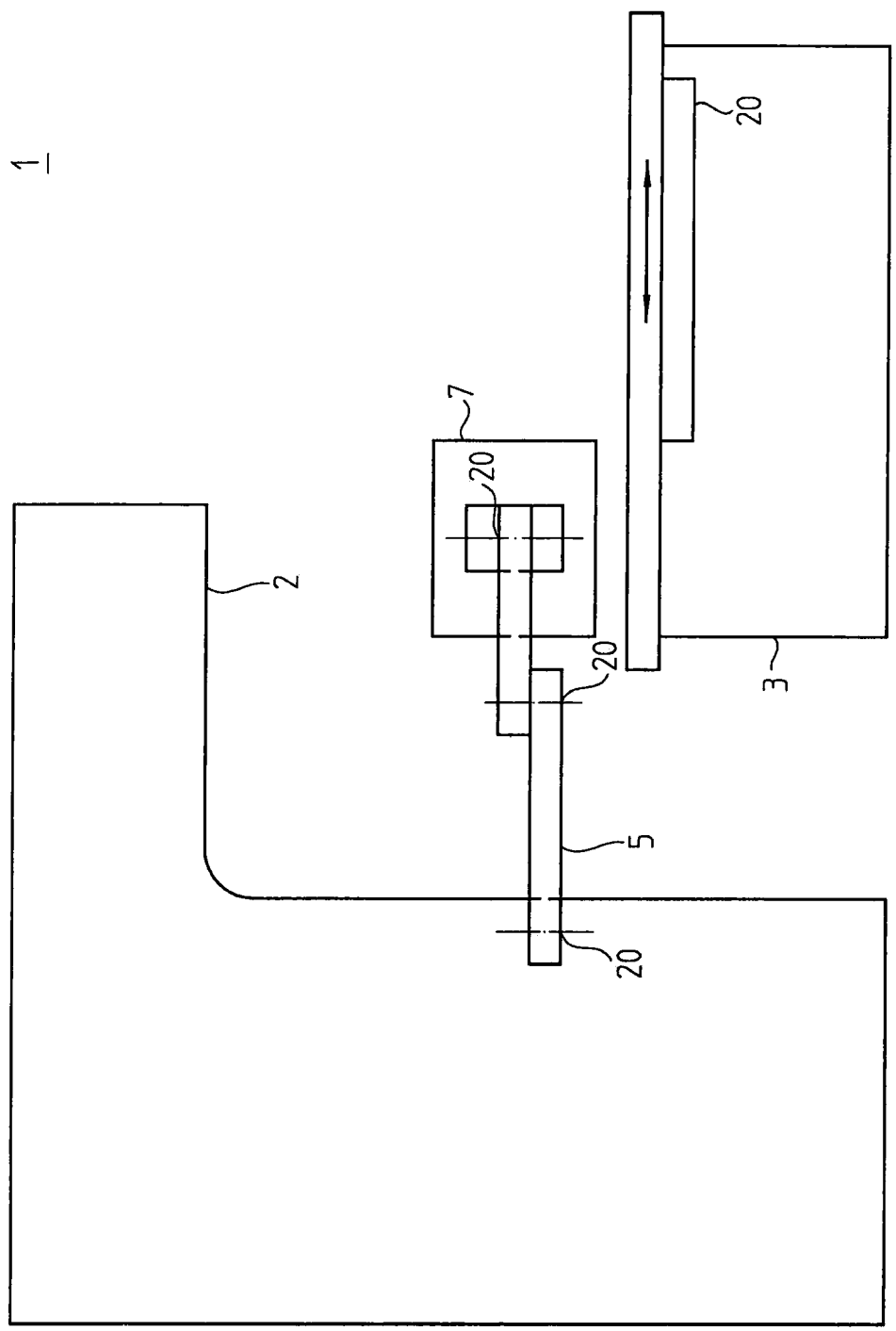

ABSOLUTE POSITION-MEASURING DEVICE

CROSS-REFERENCE TO RELATED APPLICATIONS

The present application claims priority to Application No. 10 2012 218 890.8, filed in the Federal Republic of Germany on Oct. 17, 2012, which is expressly incorporated herein in its entirety by reference thereto.

FIELD OF THE INVENTION

The present invention relates to an absolute position-measuring device. An absolute position-measuring device of this type is capable of being used in installations or machines in which it is exposed to high-energy ionizing radiation.

BACKGROUND INFORMATION

Position-measuring devices are needed in many different technical fields in order to determine the position (length or/and angle) of movable components in installations and machines. Such position-measuring devices are divided into two groups based on their operating principle. First of all, there are incremental, position-measuring devices in which the position is ascertained based on the counting of graduation periods of an incremental graduation, and secondly, there are absolute position-measuring devices in which the position is obtained by scanning and evaluating an absolute graduation.

Compared to absolute position-measuring devices, incremental position-measuring devices have a simple, robust design, but have the disadvantage that immediately after being switched on, no position information is available, and a reference mark must first be overtraveled by what is referred to as a reference measurement, in order to be able to infer the absolute position. That is why in many technical sectors, absolute position-measuring devices are employed by preference, using which, an absolute position value is available at any time, even immediately after being switched on For example, an absolute position-measuring device is described in European Published Patent Application No. 0 660 209.

One technical field in which the use of absolute position-measuring devices is still problematic involves installations or machines which are exposed to ionizing, high-energy radiation or whose field of application requires the use of such radiation. One such field is the medical technology field, where ionizing, high-energy radiation is used in targeted fashion to cure diseases or to slow down their progression. Predominantly gamma radiation, X-rays or particle radiation (protons, neutrons, electrons, etc.) are used.

Due to their simple structure, incremental position-measuring devices which are exposed to such radiation behave quite robustly. Absolute position-measuring devices, on the other hand, which require a more complex design in order to ascertain an absolute position value, are inclined to break down when they are exposed to ionizing, high-energy radiation.

If an absolute position-measuring device is nevertheless to be used in such an environment, e.g., in a device of medical technology for the irradiation of tumor tissue, two design approaches tend to be used: first of all, shielding the absolute position-measuring device from the harmful radiation, and secondly, constructing the position-measuring device from what are referred to as radiation-hardened components, e.g., components which are adapted especially for this application area.

Both approaches are unsatisfactory in practice. In order to attain sufficient shielding effect, a centimeter-thick lead casing is necessary, which is undesirable chiefly because of its weight, but also because of its significant space requirement. Compared to standard components, radiation-hardened components are usually extremely expensive and are only available in large housings. Therefore, to construct an absolute position-measuring device from radiation-hardened components would result in a large construction and a very high price. In addition, not all components needed or desired are available in radiation-hardened form.

SUMMARY

Example embodiments of the present invention provide an absolute position-measuring device having a simple structure that is suitable for use in an environment in which it is exposed to ionizing radiation.

According to example embodiments of the present invention, an absolute position-measuring device includes a first, subassembly, having a measuring standard on which at least one code track is disposed, and a scanning unit with which, by scanning the at least one code track in a measuring direction, position signals are able to be produced from which an absolute digital position value is able to be generated. The position-measuring device also includes a second subassembly, having at least one peripheral unit adapted to perform an additional or auxiliary function of the position-measuring device. The first subassembly and the second subassembly are connected to each other by a plurality of electric lines for the transmission of electrical signals, and the first subassembly exclusively includes components that are suitable for use in a radiation area of a machine.

Further features and aspects of example embodiments of the present invention are described in more detail below with reference to the appended Figures.

BRIEF DESCRIPTION OF THE DRAWINGS

FIG. 1a is a schematic plan view of a medical irradiation device.

FIG. 1b is a schematic side view of a medical irradiation device.

DETAILED DESCRIPTION

Figure 2:
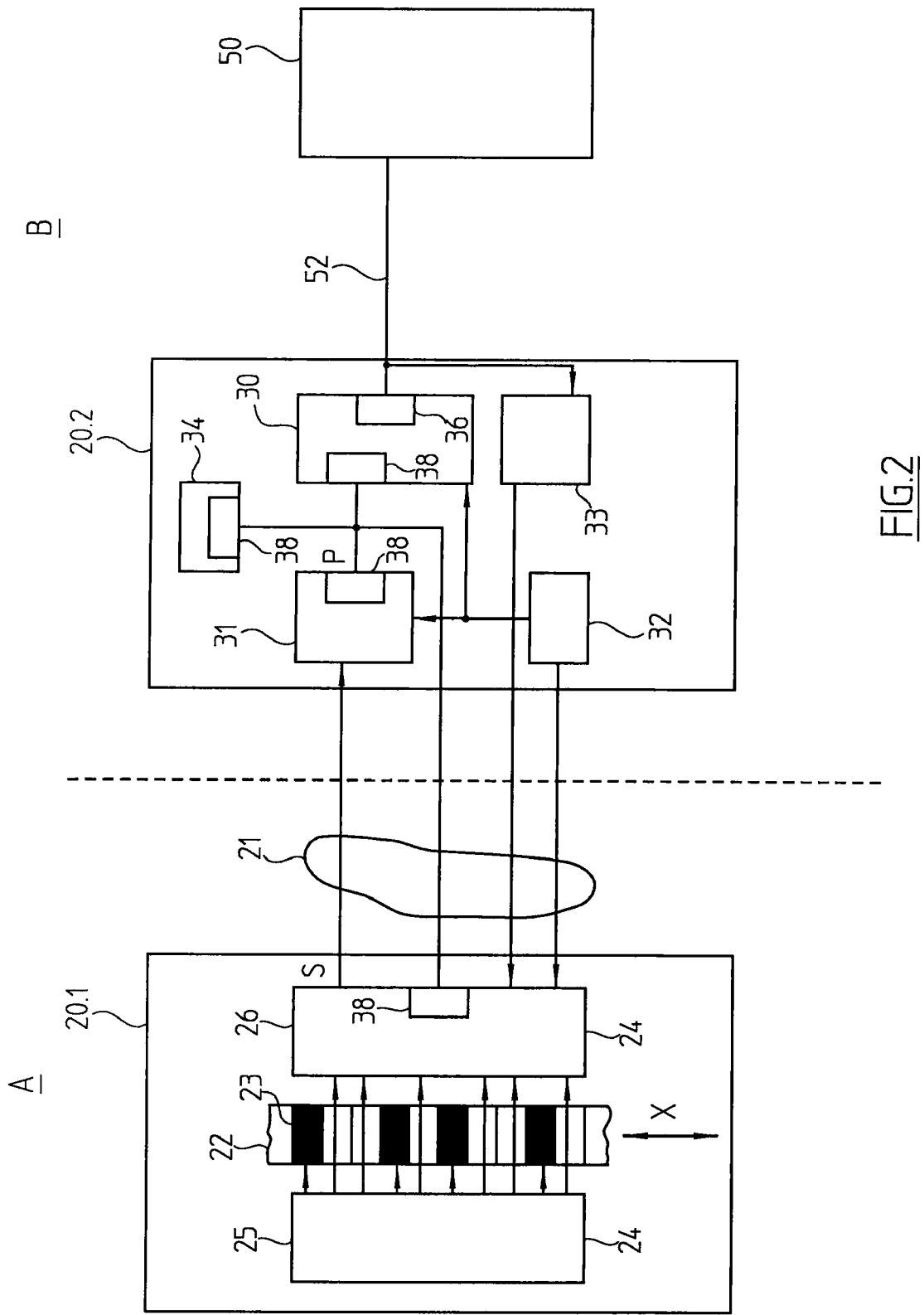
FIG. 2 is a block diagram of a position-measuring device according to an example embodiment of the present invention.

FIG. 1a is a schematic plan view and FIG. 1b is a schematic side view of a medical irradiation device 1 as example for an installation in which ionizing, high-energy radiation, especially gamma radiation, X-rays or electron radiation, is used. A radiation source 2 of irradiation device 1 is located above the marked head end of a patient examination table 3. For clarity, a detailed representation of the radiation source is not included. It is assumed that the ionizing, high-energy radiation, which is used to irradiate a tumor, for example, can occur predominantly within circle 10 shown in FIG. 1a. Therefore, the area within circle 10 is referred to below as radiation area A. Outside of radiation area A, and thus outside of circle 10, is a radiation-proof area B.

This division is greatly simplified and is used primarily for the purpose of describing example embodiments of the present invention. The energy of the radiation that occurs decreases with increasing distance from the radiation source, e.g., no exact boundary line can be drawn. For the following explanations, the designation radiation area A should be understood to be the area of an installation in which ionizing, high-energy radiation may occur in a dose which can impair the functional reliability of a conventional, absolute position-measuring device. On the other hand, radiation-proof area B is denoted as the area around an installation in which the functional reliability of conventional, absolute position measuring devices is not impaired by the radiation occurring.

Besides the observance of a specific minimum distance from the radiation source, a radiation-proof area B may also be produced by mounting a shielding barrier in the direction of propagation of the radiation. Lead is an especially suitable material for this purpose.

Two robot arms 5 and 6 are disposed on the medical irradiation device, first robot arm 5 bearing a transmitter unit 7 and second robot arm 6 bearing a receiver unit 8 of a computer tomography (CT) scanner. Robot arms 5, 6 are used to precisely position transmitter unit 7 and receiver unit 8 with the aid of servomotors, their position being determined by position-measuring devices 20, particularly rotary encoders or angle encoders located in the articulations of robot arms 5, 6.

The patient examining table is movable in the direction of the arrow, its position being measured by a further position-measuring device 20, particularly a linear encoder.

In such medical irradiation devices, in part, a radiation energy of more than 20 MeV may be used. Thus, a considerable dose of radiation may be introduced into position-measuring devices 20 over the service life of such an installation. The radiation used may be gamma radiation, X-rays or particle radiation (protons, neutrons, electrons, etc.).

FIG. 2 Is a block. diagram of a position-measuring device 20 according to an example embodiment of the present invention, which is suitable for use in an installation in which position-measuring device 20 may be exposed to an ionizing, high-energy radiation. Position-measuring device 20 includes a first subassembly 20.1 and a second subassembly 20.2. In order to transmit electrical signals between first subassembly 20.1 and second subassembly 20.2, they are connected to each other via a plurality of electric lines 21.

To generate position signals S, which are able to be processed to form an absolute position value P, first subassembly 20.1 includes a measuring standard 22 having at least one code track 23, as well as a scanning unit 24 for scanning the at least one code track 23. Code track 23 may be parallel-coded (e.g., Gray code) or, as indicated in FIG. 2, serially coded (Pseudo Random Code, PRC). However, the coding may also be implemented in analog fashion, for instance, by several parallel code tracks 23 which have a different graduation period (beat or vernier principle). Measuring standard 22 and scanning unit 24 are moveable relative to each other in a measuring direction X.

If position-measuring device 20 is a linear encoder, then measuring standard 22 is a scale, for example, on which code. track 23 is applied. In the case of a rotary encoder or angle encoder, measuring standard 22 is usually in the form of a circular disk, and code track 23 is disposed in annular fashion about the midpoint of the disk.

In this exemplary embodiment, it is assumed that position-measuring device 20 operates according to the optical transmitted-light principle, that is, the position information of code track 23 is encoded by a sequence of transparent and nontransparent areas, and scanning unit 24 includes a light source 25 which is disposed on one side of measuring standard 22 and emits light in the direction of code track 23, and a detector unit 26 which generates position signals S from the light modulated by code track 23. Position signals S may be available in both analog and digital form, and are suitable for generating an absolute digital position value P from them.

In addition to the optical scanning principle, other scanning principles are also possible, particularly magnetic, capacitive, inductive, etc., scanning principles. An optical incident-light principle may be used as well, in which code track 23 includes reflective and non-reflective areas, and therefore, according to this alternative, light source 25 and detector unit 26 may be disposed on one side of measuring standard 22.

According to example embodiments of the present invention, all components of first subassembly 20.1 of position-measuring device 20 are arranged such that they are suitable for use in a radiation area A or a machine. In FIG. 2, radiation area A is left of the vertical dotted line.

Second subassembly 20.2 includes peripheral units of position-measuring device 20 which perform additional or auxiliary functions. For example, second subassembly 20.2 may include a communications unit 30, a signal-processing unit 31, a reset unit 32, a voltage-supply unit 33, and a memory unit 34, etc.

On the one side, communications unit 30 makes a digital device interface 36 available, via which communication takes place with a control unit 50. Device interface 36 includes, first. of all, the physical conditions for the communication (signal level, data rate, plug-in connector, etc.) and secondly, a communication protocol which establishes the communication rules between position-measuring device 20 and control unit 50. Advantageously, device interface 36 is in the form of a serial, especially a synchronous-serial interface, the signals being transmitted differentially in a conventional manner, e.g., according to the RS-485 standard. Second subassembly 20.2 and control unit 50 are connected to each other via a suitable data-transmission cable 52.

On the other side, communications unit 30 makes an internal interface 38 available which. may be used for communication with peripheral units of second subassembly 20.2 (with signal-processing unit 31 and memory unit 34 in the example illustrated), or else with first subassembly 20.1, (e.g., scanning unit 24 or detector unit 26). Internal interface 38 also provides the physical conditions for the communication and may include an interface protocol. Data may be transmitted. in parallel or serially. All components which. communicate with internal interface 38 of communications unit 30 have an internal interface 38. Since it is advantageous if the communication is controlled by communications unit 30, internal interface 38 of communications unit 30 is preferably implemented as what is termed a master interface, and internal interface 28 of the further components is implemented as slave interface.

Signal-processing unit 31 is used to generate a digital absolute position value P from position signals 3, which are supplied by first subassembly 20.1 co second subassembly 20.2 via electric lines 21, and to transmit it, possibly as a response to a position-request instruction of control unit 50, via internal interface 38 to communications unit 30. The functions of signal-processing unit 31 for this purpose may include analog-to-digital conversion, recognition of faulty position signals S, selection of valid signals from a number of redundant position signals S, etc.

The functions of reset unit 32 may include, for example, the monitoring of the supply voltage of position-measuring device 20 and the output of a reset signal in the event of fluctuations in the supply voltage, in order to prevent indefinite operating states. Reset unit 32 also ensures, for example, that after position-measuring device 20 is switched on, normal operation is not enabled until the supply voltage has stably exceeded a specific voltage level. The reset signal may also be supplied, both to peripheral units of second subassembly 20.2 (communications unit. 30 and signal-processing unit 31 in the example illustrated), and via electric lines 21 to first subassembly 20.1.

Voltage-supply unit 33 is used to stabilize a supply voltage, which is supplied by control unit 50 to position-measuring device 20, e.g., via data-transmission cable 52, and/or to adjust the voltage level to the requirements of the components of the position-measuring device, i.e., of first subassembly 20.1 and second subassembly 20.2. To that end, it may be necessary that voltage-supply unit 33 make a plurality of different outputs, possibly with different voltages, available, and transmit via electric lines 21 to first subassembly 20.1. Likewise, voltage-supply unit 33 may be capable of generating one or more constant output voltages from a variable input voltage.

Memory unit 34 is often used in position-measuring devices 20 to store data which is relevant for the operation of position-measuring device 20. In particular, parameters of position-measuring device 20 may be stored in memory unit 34. Examples for this are the type of measuring system, serial number, resolution, data format, direction of rotation of the measuring system, calibration data, etc. Memory unit 34 may be read out and possibly also written into via internal interface 38. Moreover, memory contents may also be transmitted via internal interface. 38 to first subassembly 20.1. Control unit 50 may access memory unit 34 via device. interface 36 and internal interface. 38, with mediation of communications unit 30.

Second subassembly 20.2 of position-measuring device 20 is located in radiation-proof area P (right of the dotted line). It is therefore not necessary to furnish second subassembly 20.2 with radiation-resistant (radiation-hardened) components.

One aspect. of example embodiments of the present. invention is that components whose function does not contribute directly to the generating of position signals S, i.e., of absolute position. values P, may also be disposed spatially separate from first subassembly 20.1. This provides for the possibility of arranging only the components of first subassembly 20.1 such that they are operable in radiation area A without being impaired by the ionizing, high-energy radiation, and on the other hand, to provide the components of second subassembly 20.2 using conventional technology.

A significant cost savings may thereby be achieved, since components in conventional technology may be purchased far more inexpensively in comparison to radiation-resistant (radiation-hardened) components. Moreover, conventional components are more readily available. In addition, not all needed components are even available in radiation-resistant form. Memory modules have proven so be especially problematic in this regard.

Besides the advantages in terms of price and availability of the components used, in the case of a position-measuring device 20, the space requirement for first subassembly 20.1 may possibly even be reduced in comparison to conventional position-measuring devices, since only a very few components are included in first subassembly 20.1.

Figure 3:
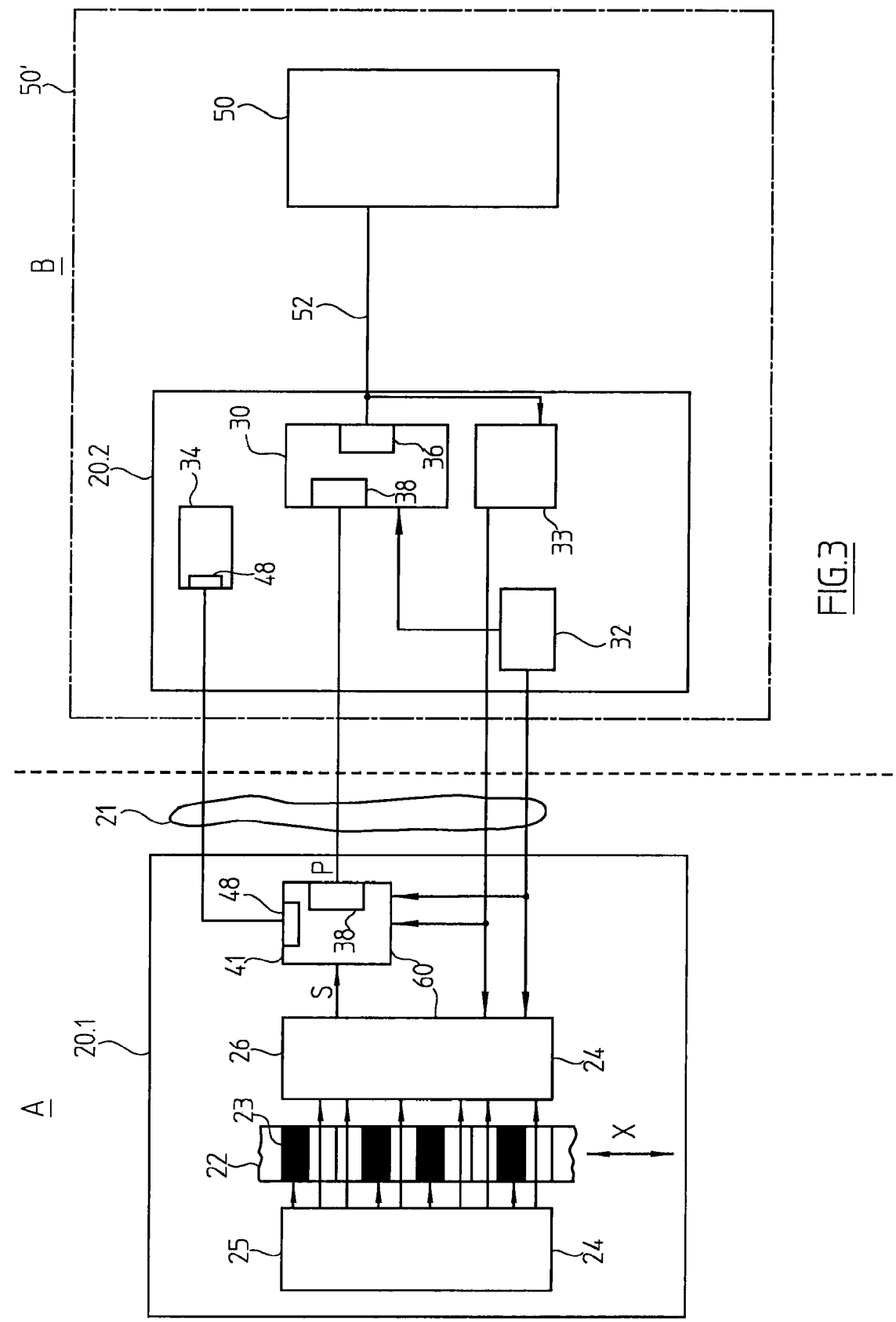
FIG. 3 is a block diagram of a position-measuring device according to an example embodiment of the present invention.

FIG. 3 is a block diagram of a position-measuring device 20 according to an example embodiment of the present invention. Components which were already described in connection with FIG. 2 bear the same reference numerals and are not described again.

Differing from the exemplary embodiment illustrated in FIG. 2, a signal-processing unit 41 is provided in first subassembly 20.1. This has the advantage that a digital, absolute position value P is produced in first subassembly 20.1 and may be transmitted via internal interface 38 to communications unit 30 in the second subassembly. Because data is transmitted within the framework of a data-transmission protocol, by e.g., suitable conventional measures (e.g., generation and transmission of checksums, etc.), a reliable transmission of digital, absolute position values P may be ensured. This holds true especially when, due to the distance between. radiation area A and radiation-proof area B, the spatial distance between first subassembly 20.1 and second. subassembly 20.2 is large (e.g., several meters).

In order to achieve the greatest possible interference immunity in transmitting data between signal-processing unit. 41 and communications unit 30, a differential data transmission, e.g., according to she RS-485 standard, may be employed for the physical transmission, even in the case of internal interface 38. However, since suitable driver modules have the disadvantages already mentioned above (high price, problematic availability, large construction, etc.), the physical transmission of data may also be performed using single-ended digital signals. In any case, electric lines 21 via which data is transmitted must be adapted so the physical transmission selected.

Besides internal interface 38, signal-processing unit 41 also has a separate memory interface 48, via which signal-processing unit 41 is connected directly to a corresponding memory interface 48 of memory unit 34 in second subassembly 20.2. In this manner, signal-processing unit 41 is able to read out or write memory contents of memory unit 34 directly without detour via communications unit 30. For example, an interface which is already available in conventional memory units 34, e.g., an I2C-interface, is used as memory interface. In this exemplary embodiment, sequential electronics 50 may access memory unit 34 via communications unit. 30 and signal-processing unit 41 with the aid of device. interface 36, internal interface. 38, and memory interface 48. Alternatively, however, communications unit 30 and memory unit 34 may also be connected via a separate interface in order to permit direct. communication without the detour via first subassembly 20.1. Suitable electric lines 21 are also provided for transmitting data between signal-processing unit 41 and memory unit 34.

If device interface 36 and internal interface 38 are identical, then communications unit 30 may also include only the electromechanical, connection (plug-in connector and electric lines) between device interface 36 and internal interface 38. Likewise, the possibility exists to provide, no communications unit 30 at all in second. subassembly 20.2, and to connect control unit directly with data-transmission cable 52 to first subassembly 20.1.

The division selected in FIG. 3 is particularly favorable, because in modern position-measuring devices 20, detector unit 26 and signal-processing unit 41 together with corresponding interfaces 38, 48 are frequently integrated together in one highly integrated module 60 (ASIC, or in the case of optical scanning, Opto-ASIC). This means that only highly integrated module 60 must be upgraded for use in an installation in which position-measuring device 20 may be exposed to ionizing, high-energy radiation, since the remaining components of the first subassembly—light source 25 and measuring standard 22—already exhibit the suitability for use in radiation area A without requisite modifications.

As illustrated in FIG. 3, second subassembly 20.2 may be arranged in its own housing spatially separate from sequential electronics 50. This has the advantage that sequential electronics 50 do not have to know at all that position-measuring device 20 includes two subassemblies. In the case of installations in which absolute position-measuring devices are already used that are protected by costly shielding measures (e.g., lead casing) from the radiation occurring, it is thereby especially easy to replace these position-measuring devices with position-measuring devices 20 described herein and to remove the unwanted weight of the shielding. Care must only be taken that device interface 36 is compatible.

Differing from that, however, it is also possible to integrate second. subassembly 20.2 into sequential electronics 50', as indicated by the block drawn with dots and dashes.

What is claimed is:

1. An absolute position-measuring device, comprising:
 a first subassembly having a measuring standard on which at least one code track is disposed, and a scanning unit adapted to scan the code track in a measuring direction to produce position signals for generating an absolute digital position; and
 a second subassembly having at least one peripheral unit adapted to perform an additional and/or an auxiliary function of the position-measuring device;
 wherein the first subassembly and the second subassembly are connected to each other by a plurality of electric lines to transmit electrical signals;
 wherein the first subassembly exclusively includes components adapted for use in a radiation area of a machine; and
 wherein the second subassembly includes components unsuitable for use in the radiation area of the machine.

2. The absolute position-measuring device according to claim 1, wherein the first subassembly includes a signal-processing unit adapted to generate the digital position value from the position signals.

3. The absolute position-measuring device according to claim 2, wherein the signal-processing unit includes an internal interface adapted to transmit the digital position value to a communications unit in the second subassembly.

4. The absolute position-measuring device according to claim 3, wherein the signal-processing unit includes a memory interface adapted to read and/or write memory contents of a memory unit located in the second subassembly.

5. The absolute position-measuring device according to claim 4, wherein the detector unit and the signal-processing unit are arranged as a highly integrated module.

6. The absolute position-measuring device according to claim 3, wherein the detector unit and the signal-processing unit are arranged as a highly integrated module.

7. The absolute position-measuring device according to claim 2, wherein the signal-processing unit includes a memory interface adapted to read and/or write memory contents of a memory unit located in the second subassembly.

8. The absolute position-measuring device according to claim 7, wherein the detector unit and the signal-processing unit are arranged as a highly integrated module.

9. The absolute position-measuring device according to claim 2, wherein the detector unit and the signal-processing unit are arranged as a highly integrated module.

10. A system, comprising:
 a machine having a radiation area; and
 an absolute position-measuring device including:
  a first subassembly having a measuring standard on which at least one code track is disposed, and a scanning unit adapted to scan the code track in a measuring direction to produce position signals for generating an absolute digital position; and
  a second subassembly having at least one peripheral unit adapted to perform an additional and/or an auxiliary function of the position-measuring device;
  wherein the first subassembly and the second subassembly are connected to each other by a plurality of electric lines to transmit electrical signals;
  wherein the first subassembly exclusively includes components adapted for use in the radiation area of the machine; and
  wherein the second subassembly includes components unsuitable for use in the radiation area of the machine.

* * * * *